US006326221B1

(12) United States Patent
Lee et al.

(10) Patent No.: US 6,326,221 B1
(45) Date of Patent: Dec. 4, 2001

(54) METHODS FOR MANUFACTURING FIELD EMITTER ARRAYS ON A SILICON-ON-INSULATOR WAFER

(75) Inventors: Jong Duk Lee, Department of Electronics Engineering, College of Engineering, Seoul National University, Shin Lim-dong, Kwanak-ku, Seoul; Cheon Kyu Lee; Hyung Soo Uh, both of Seoul, all of (KR)

(73) Assignees: Korean Information & Communication Co., Ltd.; Jong Duk Lee, both of Seoul (KR)

( * ) Notice: Subject to any disclaimer, the term of this patent is extended or adjusted under 35 U.S.C. 154(b) by 0 days.

(21) Appl. No.: 09/146,597

(22) Filed: Sep. 3, 1998

(30) Foreign Application Priority Data

Sep. 5, 1997 (KR) ........................................ 97-45945

(51) Int. Cl.[7] ........................................ H01L 21/00

(52) U.S. Cl. ........................ 438/20; 257/10; 445/50

(58) Field of Search ........................ 438/20, 22, 23, 438/30, 28; 257/10; 445/50, 51, 49

(56) References Cited

U.S. PATENT DOCUMENTS

| | | | | |
|---|---|---|---|---|
| 5,266,530 | * | 11/1993 | Bagley | 437/228 |
| 5,359,256 | * | 10/1994 | Gray | 313/169 |
| 5,455,196 | * | 10/1995 | Frazier | 437/187 |
| 5,651,713 | | 7/1997 | Lee et al. . | |
| 5,688,707 | * | 11/1997 | Lee et al. | 437/51 |
| 5,726,073 | * | 3/1998 | Zhang | 437/228 |
| 5,780,318 | * | 7/1998 | Hirano | 438/20 |
| 5,798,558 | * | 8/1998 | Tyson | 257/458 |
| 5,872,019 | * | 2/1999 | Lee | 438/20 |
| 6,027,951 | * | 2/2000 | MacDonald | 438/20 |
| 6,069,018 | * | 5/2000 | Song | 438/20 |
| 6,114,217 | * | 9/2000 | Park | 438/424 |

FOREIGN PATENT DOCUMENTS

| | | |
|---|---|---|
| 9/17335 | 1/1997 | (JP) . |
| 9/102269 | 4/1997 | (JP) . |
| 96/26078 | 7/1996 | (KR) . |
| 97/3346 | 1/1997 | (KR) . |

* cited by examiner

*Primary Examiner*—Carl Whitehead, Jr.
*Assistant Examiner*—David Goodwin
(74) *Attorney, Agent, or Firm*—Dilworth & Barrese LLP

(57) ABSTRACT

The present invention provides methods for manufacturing field emitter arrays on a silicon-on-insulator (SOI) wafer, one of which comprising steps of forming a doped silicon layer by doping a dopant on a single crystalline silicon layer of an SOI wafer; making a buffer oxide layer on the doped silicon layer; making a stripe pattern of silicon nitride on the buffer oxide layer; etching the buffer oxide layer using the stripe pattern as a mask; etching the doped silicon layer anisotropically using the stripe pattern as a mask; making a minute mask pattern of silicon nitride on the buffer oxide layer by patterning the stripe pattern of silicon nitride; selectively oxidizing the upper part of the doped silicon layer to form an oxide layer except on the portions under the mask pattern; etching away the mask pattern of silicon nitride and the buffer oxide layer deposited under the mask pattern; etching away the exposed doped silicon layer for making gate holes of undercut shape; forming metal layers on the SOI wafer and the bottom of the gate holes by evaporating a metallic evaporant downwardly and vertically against the surface of the SOI wafer; and forming the field emitter tips on the metal layer in the gate holes. According to the present invention, electrical isolation between one cathode line and the other may be accomplished without any junction isolation step and an extremely small size of the field emission elements may be formed uniformly over a large area.

7 Claims, 3 Drawing Sheets

METHODS FOR MANUFACTURING FIELD EMITTER ARRAYS ON A SILICON-ON-INSULATOR WAFER

BACKGROUND OF THE INVENTION

The present invention relates to a method for manufacturing field emitter arrays on a silicon-on-insulator (SOI) wafer by means of local oxidation of silicon (LOCOS) and for manufacturing field emitter arrays incorporated with MOSFETs (Metal Oxide Semi-conductor Feild Effect Transistors) on an SOI wafer.

The prior art to which the invention is related includes a method for manufacturing a low voltage driven field emitter array (the U.S. Pat. No. 5,651,713), which can make. gate hole patterns on a silicon substrate with the diameter of less than 0.5 μm and smaller than those formed by a photomask aligner by reducing the sizes of gate holes by LOCOS technique that has been used in the conventional semiconductor manufacturing process.

The other prior arts are a method for manufacturing Si-FEAs (the U.S. Pat. No. 5,688,707) formed uniformly over a large area by etching polycrystalline or amorphous silicon layer deposited on an insulating substrate.

The former method for manufacturing a low voltage driven field emitter array provides a field emitter array on a silicon substrate with gate holes, the diameters of which are smaller than those formed by a photomask, reduced gate electrodes corresponding to the reduced gate holes and small metal field emitter tips suitable to the reduced gate electrodes, using a process for reducing the size of the gate holes during the gate insulating layer formation step.

According to the above method for manufacturing a low voltage driven field emitter array, a starting material may be a doped silicon substrate or a quartz substrate deposited thereon with a doped polycrystalline silicon or amorphous silicon. Further, according to the latter method for manufacturing Si-FEAs, silicon field emitter arrays can be formed uniformly over a large area with pixels insulated therebetween, using polycrystalline or amorphous silicon layer deposited on an insulating substrate as a starting material.

For using the metal field emitter array or Si-FEA made as above for a field emission display, each cathode line should be electrically isolated from others, through the junction isolation, which may makes the array liable to be unreliable and cause the manufacturing processes complex.

More particularly, a matrix panel of a field emission display has to be provided with isolated wells and gates crossing each other and electrons are emitted from microtips located on crossing points by an adequate voltage simultaneously applied between gates and wells functioning as cathodes and then accelerated toward the corresponding anode, thus producing light from the cathodoluminescent phosphor on the anode. Unfortunately, the steps for making well-to-well electrical isolation of the array for use in the above display have such problems as the above mentioned. The inventors have invented methods for manufacturing field emitter arrays in which electrical isolation between one cathode line and the other may be accomplished without junction isolation for solving the above problems.

SUMMARY OF THE INVENTION

The object of the present invention is to provide a method for manufacturing field emitter arrays in which electrical isolation between one cathode line and the other is easily accomplished, the field emitter arrays made have minute gate holes and the corresponding minute gate electrodes and small metal field emitter tips are formed uniformly.

Another object of the present invention is to provide a method for manufacturing Si-FEAs in which electrical isolation between one cathode line and the other may be easily accomplished and the field emitter tips are formed uniformly over a large area.

Still another object of the present invention is to provide a method for manufacturing field emitter arrays incorporated with MOSFETs in which electrical isolation between one cathode line and the other is easily accomplished and field emitter arrays and MOSFETs for driving the field emitter arrays are formed on a single wafer, thereby achieving reduction of drive power and improvement on the quality of the FED.

According to an aspect of the present invention, using an SOI wafer as a staring substrate, metal field emitter arrays are manufactured by a process, comprising the steps of;

- forming a doped silicon layer by doping a dopant on a single crystalline silicon layer of an SOI wafer;
- making a buffer oxide layer on the doped silicon layer;
- making a stripe pattern of silicon nitride on the buffer oxide layer;
- etching the buffer oxide layer using the stripe pattern as a mask;
- etching the doped silicon layer anisotropically using the stripe pattern as a mask;
- making a minute mask pattern of silicon nitride on the buffer oxide layer by patterning the stripe pattern of silicon nitride;
- selectively oxidizing the upper part of the doped silicon layer to form an oxide layer except on the portions under the mask pattern;
- etching away the mask pattern of silicon nitride and the buffer oxide layer deposited under the mask pattern;
- etching away the exposed doped silicon layer for making gate holes of undercut shape;
- forming metal layers on the SOI wafer and the bottom of the gate holes by evaporating a metallic evaporant downwardly and vertically against the surface of the SOI wafer; and
- forming the field emitter tips on the metal layer in the gate holes.

According to another aspect of the present invention, using an SOI wafer as a starting substrate, silicon field emitter arrays are manufactured by a process, comprising the steps of:

- forming a doped silicon layer by doping a dopant on a single crystalline silicon layer of an SOI wafer;
- making a minute oxide layer disk pattern on the doped silicon layer;
- etching the doped silicon layer isotropically using the oxide layer disk pattern as a mask, for making field emitter tips;
- forming hollows between the neighboring cathode lines for electrically insulating them from each other by etching the doped silicon layer;
- forming a silicon oxide layer on the upper part of the doped silicon layer by means of a first oxidation thereof;
- depositing a silicon nitride layer on the silicon oxide layer;

removing the silicon nitride layer except that of the sidewall parts around the field emitter tips;

forming a gate insulating layer by means of a second oxidation and removing the silicon nitride layer of the sidewall parts around the field emitter tips;

making contact windows by removing parts of the gate insulting layer for cathode contact with an external driving circuit;

depositing a metalic evaporant on the gate insulating layer and contact windows to form gate electrodes and cathode contacts;

etching away the silicon oxide layers around the field emitter tips and the metal deposited thereon; and patterning the gate electrodes and cathode contacts.

Furthermore, according to the other aspect of the present invention, there is provided a method for manufacturing field emitter arrays incorporated with MOSFETs using an SOI wafer as a staring substrate by a process, comprising the steps of:

forming a first doped silicon layer and a second doped silicon layer with a predetermined interval by partially doping a dopant on a single crystalline silicon layer of an SOI wafer;

making a minute oxide disk pattern on the first doped silicon layer etching the doped silicon layers and the non-doped silicon layer isotropically using the oxide disk pattern as a mask for making field emitter tips;

forming a silicon oxide layer on the upper part of the doped silicon layers and the non-doped silicon layer by means of a first oxidation thereof;

deposting a silicon nitride layer on the silicon oxide layer;

removing the silicon nitride layer except that of sidewall parts around the field emitter tips by an anisotropical etching method;

coating photoresist layers on the first and second doped silicon layers, respectively;

performing boron doping on the portion between one photoresist layer and the other, thereby forming a doping channel;

removing the phothresist layers and forming a gate insulating layer on the doped silicon layers and the non-doped silicon layer by means of a second oxidation thereof;

removing the silicon nitride layer of the sidewall parts around field emitter tips;

removing parts of the gate insulating layer on the second doped silicon layer, thereby providing a source contact hollow;

depositing a metalic evaporant on the gate insulating layers and the source contact hollow to form gate electrodes and source contacts;

etching away the silicon oxide layer around the field emitter tips and the metal deposited thereon; and, patterning the gate electrodes and the source contacts.

BRIEF DESCRIPTION OF THE DRAWINGS

The above objects and other advantages of the present invention will become more apparent by the following detailed description of the preferred embodiments thereof made with reference to the accompanying drawings, in which.

DETAILED DESCRIPTION OF THE INVENTION

Figure 1A:
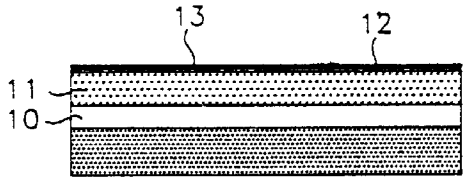
FIGS. 1A–1J are cross-sectional views showing the steps of manufacturing a metal-field emitter arrays for an FED by means of LOCOS technique on an SOI wafer according to the first embodiment of the present invention.
Figure 1B:
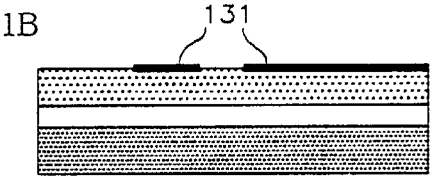

Hereinafter, the present invention will be described in detail with reference to the accompanying drawings.

(Embodiment 1)

A method for fabricating metal FEAs for an FED on an SOI wafer is shown in FIG. 1.

An SOI (Silicon-on Insulator) wafer is fabricated by a conventional SIMOX (Separation by Implantation of Oxygen) process.

In the SIMOX process, a high dose of oxygen, ranging from $4\times10_{17}$ to $2\times10_{18}$ atoms/cm$^2$, is implanted into a silicon wafer with energies of 50 KeV to 200 KeV and then the implanted water Is annealed at temperatures higher than 1300° C. for 6 hours to 8 hours, thus an SOI wafer Is formed. The fabricated SOI wafer has a layered structure consisting of a thin layer of single crystalline slicon, separated from the supporting semiconductor substrate by an Insulating layer of silicon dioxide 10. Further, an SOI wafer may be formed by a wafer-bonding process In which two silicon wafers with the thickness of about 0.1 $\mu$m~2.0 $\mu$m, both or either of which has a oxidized face, are bonded face with one oxidized face meeting the other face, then annealed at temperatures higher than 800° C. to strengthen the bond and then the bulk of one of the two is removed by grinding or polishing.

In order to use the single crystalline silicon layer of the SOI wafer as a cathode electrode and to improve electrical conductivity, a doped silicon layer 11 is formed by the methods such as $POCl_3$ doping on the single crystalline silicon layer and then, a thin buffer oxide layer 12 is deposited thereon by means of thermal oxidation. Subsequently, a silicon nitride layer 13 with the thickness of about 1500 Å~1700 Å is formed on the buffer oxide layer 12 by the LPCVD method (FIG. 1A).

Then, a silicon nitride layer stripe pattern 131 as shown in FIG. 1A is formed on the buffer oxide layer by a photo lithography process using photomask aligner.

Figure 1C:
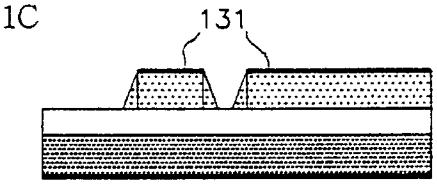

After the exposed buffer oxide layer is etched away by using the stripe pattern as a mask, the exposed doped silicon layer is anisotropically etched for achieving electrical isolation between the neighboring cathode electrodes. For preventing the gate electrodes crossing the cathode electrodes from being disconnected, an anisotropical etchant such as TMAH (Tetra methyl ammonium hydroxide) solution is preferred in the step of etching the exposed silicon layer, resulting an angle with a gentle inclination as shown in FIG. 1C.

Figure 1D:
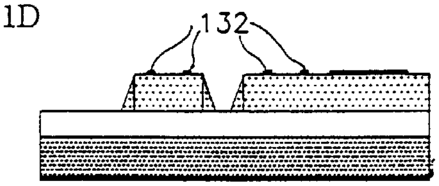

A minute silicon nitride mask pattern 132, for example, with a diameter of 1.4 $\mu$m as shown in FIG. 1D is formed by using the lithography technique so that the resultant silicon nitride mask may have a role to protect the part of the doped silicon layer under it from being oxidized during the subsequent oxidation step.

Figure 1E:
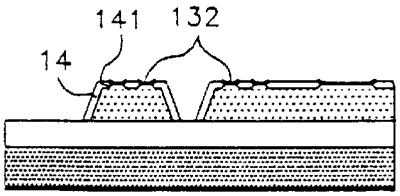
Figure 1F:
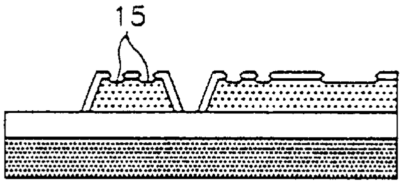

The doped silicon layer 11 is then wet- or dry-oxidized at a high temperature to form a thick oxide layer 14 onto the doped silicon layer at the part without the nitride mask pattern thereon and a thin oxide layer 141 onto the doped silicon layer with an edge with a bird's beak shape cross section at the part just under the edge of the nitride mask pattern, which are to function as gate insulating layers (FIG. 1E).

Figure 1G:
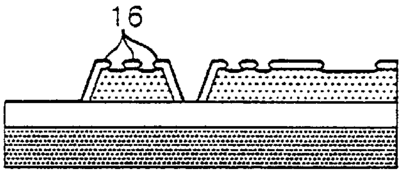
Figure 1H:
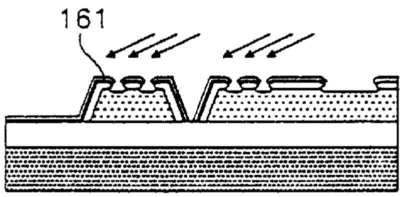
Figure 1I:
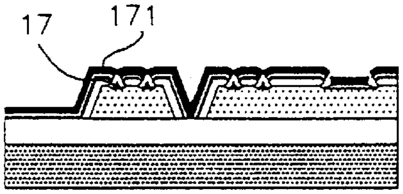
Figure 1J:
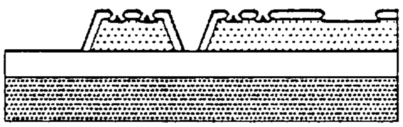

The silicon nitride mask pattern 132 is removed by wet-etching and, the buffer oxide layer 12 is then etched away so that the part of the doped silicon layer may be exposed. A gate hole 15 of a undercut shape is formed without affecting the shape of the oxide layer 141 by wet- or dry-etching the exposed silicon layer, as shown in cross section in FIG. 1F. The SOI wafer is mounted on an electron beam evaporator and a metallic evaporant is deposited downwardly and vertically against its surface, forming metal layers 16 on the surface of the gate insulating layers and on the bottom of the gate holes 15 as shown in FIG. 1G. The metallic evaporant may include molybdenum, niobium, chromium and hafnium, but are not limited to them. The known so-called Spindt process is used for the remaining steps of fabricating the field emitters. That is, mount the SOI wafer on an electron beam evaporator, deposit a parting layer 161 on the metal layers 16 through grazing incidence of about 15° of a metal vapor, form field emitter tips 17 Inside the gate holes 15 and a metal film 171 through a normal incidence of a metallic evaporant, subsequently etch off the parting layer 161 and thereby liftoff the metal film 171 deposited during the tips formation step. Finally, a metal-FEA for use in FED is completed after patterning the gate electrodes by a photo-lithography process (FIG. 1H~1J).

(Embodiment 2)

A method for fabricating a Si-FEA for use in FED on an SOI wafer is shown in FIG. 2.

Figure 2A:
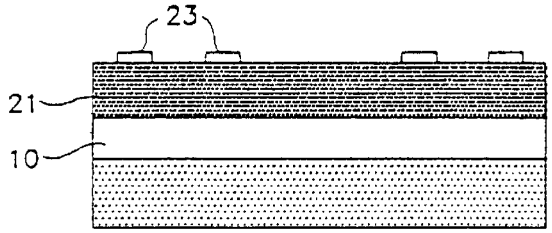
FIGS. 2A–2F are cross-sectional views showing the steps of manufacturing a Si-FEA by means of LOCOS technique on an SOI wafer according to the second embodiment of the present invention.
Figure 2B:
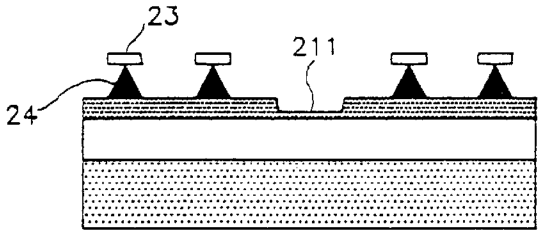

A single crystal silicon layer on an SOI wafer fabricated as in the embodiment 1 is doped: by $POCl_3$, leading to a doped silicon layer 21 which is to function as a cathode electrode of a field emitter to be made. An oxide layer is deposited on the doped silicon layer 21 by ihe PECVD method and then, a minute oxide layer disk pattern 23 as shown In FIG. 2A is formed thereon by using the lithography technique. After the doped silicon layer 21 is isotropically etched by using the oxide layer disk pattern as a mask for making cone shaped field emitter tips 24, a hollow 211 is then formed by partially etching away the doped silicon layer between one cathod electrode and the other with the thickness of 3500 Å left to insulate pixels from neighboring ones.

Figure 2C:
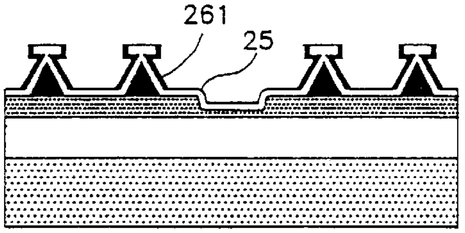
Figure 2D:
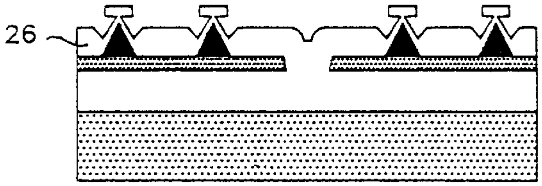

Subsequently, as shown in FIG. 2C, a silicon oxide layer 25 is formed on the upper part of the silicon layer 21 by means of a first oxidation thereof for keeping the apex of the field emitter tips 24 sharp and then, a silicon nitride layer is deposited on the silicon oxide layer 25 by the LPCVD method. The silicon nitride layer is removed except that of the sidewall parts 261 around the field emitter tips by an isotropical etching method. Further, a gate insulating layer 26 is formed by means of a second oxidation and then, the sidewall parts 261 are removed as shown in FIG. 2D. It may be noted that at the second oxidation step, the sidewall parts 261 of the silicon nitride layer may have a role to protect the apex of the tips 24 from being oxidized, thus the apex thereof is kept sharp. Furthermore, the doped silicon layer left with the thickness of 3500 Å between one cathode electrode and the other is completely consumed in the second oxidation so that the complete insulation between one cathode line and the other may be possible.

Figure 2E:
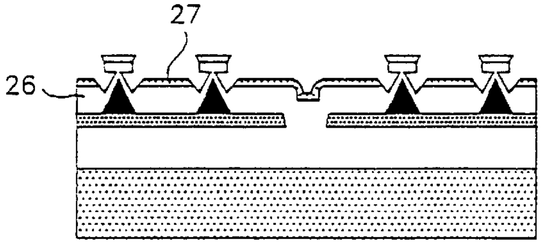

Then, parts of the gate insulating layer are removed to form contact windows (not shown) through which an external driving circuit may be connected with the cathode electrode. A metalic evaporant is then deposited on the gate insulating layers 26 and the contact windows by using an electron beam evaporator, thus gate electrodes 27 and cathode contacts (not drown) are formed (FIG. 2E)

Figure 2F:
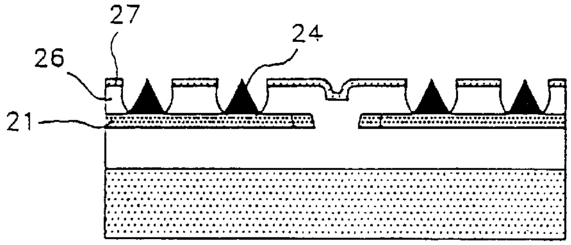

As the silicon oxide layers around the field emitter tips 24 and the metal deposited thereon are etched away by a lift-off process, a Si-FEA for FED is finally completed through patterning gate electrodes and cathode contacts (FIG. 2F).

(Embodiment 3)

A method for fabricating a FEA incorporated with MOSFETs for use in FED on an SOI wafer is shown in FIG. 3.

A single crystal silicon layer 31 on the SOI wafer fabricated as in the embodiment 1 is partially doped by $POCl_3$, leading to a first doped silicon layer 311 and a second doped silicon layer 312 at a predetermined interval.

Figure 3A:
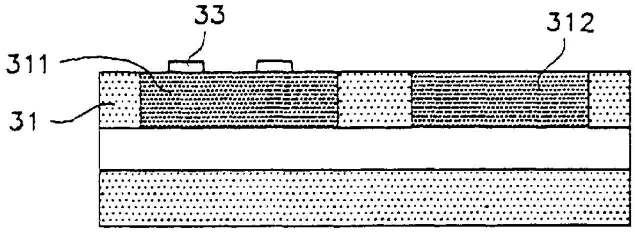
FIGS. 3A–3F are cross-sectional views showing the steps of manufacturing a field emitter array incorporated with MOSFETs on an SOI wafer.

An oxide layer is deposited on the first and second doped silicon layers 311 and 312 and the non-doped silicon layer 31 by the PECVD method and then, a minute oxide disk pattern 33 as shown in FIG. 3A is formed on the first doped silicon layer 311 by using the lithography technique.

Figure 3B:
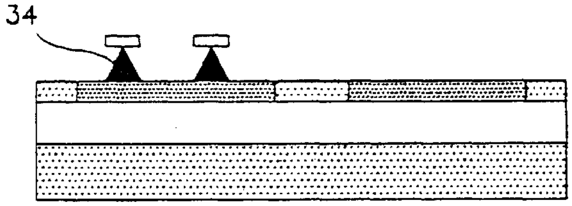

Then, the first and second silicon layers 311 and 312 and the non-doped single crystal silicon layer 31 are isotropically etched by using the oxide layer disk pattern 33 as a mask, making cone shaped field emitter tips 34 (FIG. 3B).

Figure 3C:
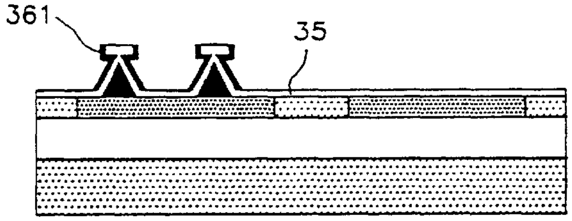

After a silicon oxide layer 35 is formed on the upper parts of the silicon layers by means of a first oxidation thereof, a silicon nitride layer is deposited on the silicon oxide layer 35 by the LPCVD method and then, the silicon nitride layer is removed except that of the sidewall parts 361 around the field emitter tips 34 by anisotropical etching method as shown in FIG. 3C.

Figure 3D:
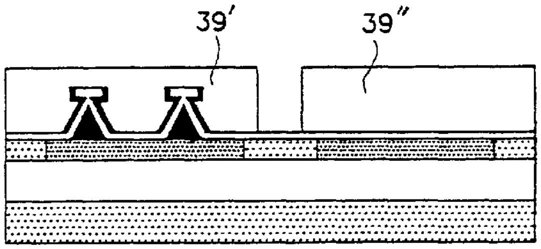
Figure 3E:
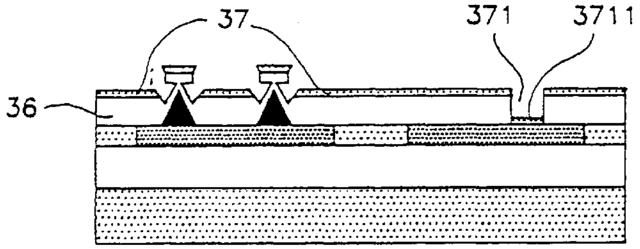

Photoresist layers 39' and 39" are coated on the first and second doped silicon layers 311 and 312 respectively and then, boron doping is carried out on the portion between the photoresist layers 39' and 39" by an implanter, thereby forming a doping channel which may provide further increase in the field threshold voltage (FIG. 3D).

Subsequently, the photoresist layers are stripped away from the doped silicon layers 311 and 312, a gate insulating layer 36 is formed on the silicon layers by means of a second oxidation and then, the sidewall parts 361 are removed.

Consequently, parts of the gate insulating layer 36 deposited on the second doped silicon layer 312 are removed for providing a source contact hollow 371 and then, a metalic evaporant is deposited over the entire exposed surface of the resulting structure to provide gate electrodes 37 and source contacts 371 by using an electron beam evaporator.

Figure 3F:
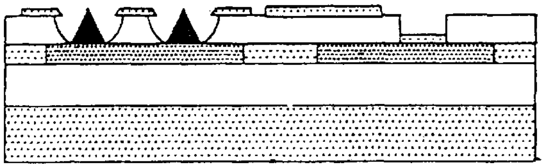

As the silicon oxide layers around the field emitter tips 34 and the metal deposited thereon are etched away by lift-off process, an FEA incorporated with MOSFETs for use in FED is finally completed after patterning gate electrodes and source contacts (FIG. 3F).

According to the present invention, metal field emitter arrays or Si-FEAs for use in FED are manufactured by using an SOI water, thereby accomplishing electrical isolation between one cathode line and the other without any junction isolation step and having an extremely small size of the field emission elements formed uniformly over a large area.

Further, according to the present invention, field emitter arrays incorporated with MOSFETs for FED are manufactured by using an SOI wafer, thereby accomplishing electrical isolation between one cathode line and the other without any junction isolation and achieving reduction in drive power and improvement on the uniformity of pixels.

What is claimed is:

1. A method for manufacturing a field emitter array on an SOI wafer, comprising the steps of:

forming a doped silicon layer by doping a dopant on a single crystalline silicon layer of an SOI wafer;

making a buffer oxide layer on the doped silicon layer;

making a stripe pattern of silicon nitride on the buffer oxide layer;

etching the buffer oxide layer using the stripe pattern as a mask;

etching the doped silicon layer anisotropically using the stripe pattern as a mask;

making a minute mask pattern of silicon nitride on the buffer oxide layer by patterning the stripe pattern of silicon nitride;

selectively oxidizing the upper part of the doped silicon layer to form an oxide layer except on the portions under the mask pattern;

etching away the mask pattern of silicon nitride and the buffer oxide layer deposited under the mask pattern;

etching away the exposed doped silicon layer for making gate holes of undercut shape;

forming metal layers in the SOI wafer and the bottom of the gate holes by evaporating a metallic evaporant downwardly and vertically against the surface of the SOI wafer; and forming field emitter tips on the metal layer in the gate holes.

2. A method for manufacturing a field emitter array on an SOI wafer as claimed in claim 1, wherein the SOI wafer is fabricated by implanting a high dose of oxygen, ranging from $4\times10^{17}$ to $2\times10^{18}$ atoms/$^{cm2}$, into a silicon wafer with energies of 50 KeV to 200 KeV and then annealing the implanted wafer at temperatures of 1300° C. to 1500° C. for 6 to 8 hours.

3. A method for manufacturing a field emitter array on an SOI wafer as claimed in claim 1, wherein the SOI wafer is fabricated by bonding two silicon wafers with the thickness of 0.1 $\mu$m~2.0 $\mu$m together in the manner of face to face, either face of which being oxidized and then removing the bulk of one of the two by polishing.

4. A method for manufacturing a field emitter array on an SOI wafer as claimed in claim 1, wherein the doped silicon layer is anisotropically etched away by using TMAH solution as an etchant.

5. A method for manufacturing a field emitter array incorporated with MOSFETs on an SOI wafer, comprising the steps of:

forming a first doped silicon layer and a second doped silicon layer with a predetermined interval by partially doping a dopant on a single crystalline silicon layer of an SOI wafer;

making a minute oxide disk pattern on the first doped silicon layer;

etching the doped silicon layers and a non-doped silicon layer isotropically by using the oxide disk pattern as a mask for making field emitter tips;

forming a silicon oxide layer on the upper part of the doped silicon layers and the nondoped silicon layer by means of a first oxidation thereof;

depositing a silicon nitride layer on the silicon oxide layer;

removing the silicon nitride layer except that of sidewall parts around the field emitter tips by an anisotropical etching method;

coating photoresist layers on the first and second doped silicon layers, respectively;

performing boron doping on the portion between one photoresist layer and the other, thereby forming a doping channel;

removing the photoresist layers and forming a gate insulating layer on the doped silicon layers and the non-doped silicon layer by means of a second oxidation thereof;

removing the silicon nitride layer of the sidewall parts around field emitter tips;

removing parts of the gate insulating layer on the second doped silicon layer, thereby providing a source contact hollow;

depositing a metallic evaporant on the gate insulating layers and the source contact hollow to form gate electrodes and source contacts;

etching away the silicon oxide layer around the field emitter tips and the metal deposited thereon; and patterning the gate electrodes and the source contacts.

6. A method for manufacturing a field emitter array Incorporated with MOSFETs on an SOI wafer as claimed in claim 5, wherein the SOI wafer is fabricated by implanting a high dose of oxygen, ranging from $4\times10^{17}$ to $2\times10^{18}$ atoms/$^{cm^2}$, into a silicon wafer with energies of 50 KeV to 200 KeV and then annealing the implanted wafer at temperatures of 1300° C. to 1500° C. for 6 to 8 hours.

7. A method for manufacturing a field emitter array incorporated with MOSFETs on an SOI wafer as claimed in claim 5, wherein the SOI wafer is fabricated by bonding two silicon wafers with the thickness of 0.1 $\mu$m~2.0 $\mu$m together in the manner of face to face, either face of which being oxidized and then removing the bulk of one of the two by polishing.

* * * * *